United States Patent
Lee et al.

[11] Patent Number: 5,872,041
[45] Date of Patent: Feb. 16, 1999

[54] METHOD FOR FABRICATING ELECTRODES OF A SEMICONDUCTOR CAPACITOR

[75] Inventors: Ta-Yuan Lee, Taipei Hsien; Chi-Hui Lin, Taipei, both of Taiwan

[73] Assignee: Nan Ya Technology Corp., Taiwan

[21] Appl. No.: 933,008

[22] Filed: Sep. 18, 1997

[30] Foreign Application Priority Data

Jul. 18, 1997 [TW] Taiwan .................... 86110236

[51] Int. Cl.$^6$ .................. H01L 21/70; H01L 21/8242
[52] U.S. Cl. .................. 438/397; 438/254; 438/398; 257/306
[58] Field of Search .................... 438/240, 246, 438/253, 254, 396, 397, 398, 399; 257/303, 306

[56] References Cited

U.S. PATENT DOCUMENTS

| | | | |
|---|---|---|---|
| 5,278,091 | 1/1994 | Fazan et al. | 437/52 |
| 5,604,146 | 2/1997 | Tseng | 438/253 |

OTHER PUBLICATIONS

Toru Kaga et al., Crown–Shaped Stacked–Capacitor Cell for 1.5V Operation 64–Mb DRAM's, IEEE, Transactions on Electron Devices, vol., 38, No. 2, Feb. 1991.

*Primary Examiner*—Olik Chaudhuri
*Assistant Examiner*—William David Coleman
*Attorney, Agent, or Firm*—Michael D. Bednarek; Kilpatrick Stockton LLP

[57] ABSTRACT

A method for fabricating electrodes of a capacitor over a semiconductor substrate is disclosed. The method includes the steps of: forming a base insulating layer over the semiconductor substrate; forming a stacked layer, including an insulating layer and a mask layer, over the base insulating layer; defining the stacked layer to form an opening to the base insulating layer; forming a first conducting layer over the stacked layer; forming a spacer on the sidewall of the first conducting layer in the opening; etching the bottom of the opening by using the mask layer and the spacer as a mask to expose a portion of the semiconductor substrate; forming a second conducting layer in the opening to electrically connect the exposed semiconductor substrate; and removing the spacer to leave the first and the second conducting layers as a capacitor electrode.

20 Claims, 7 Drawing Sheets

//  METHOD FOR FABRICATING
ELECTRODES OF A SEMICONDUCTOR
CAPACITOR

BACKGROUND OF THE INVENTION

1. Field of the Invention

The present invention relates to a method for fabricating the electrodes of a semiconductor capacitor, and more specifically, to a method for fabricating the electrodes of a stacked capacitor utilized in a dynamic random access memory (DRAM) cell.

2. Description of Related Art

Semiconductor capacitors have been widely utilized in semiconductor integrated circuit such as memory devices, oscillators, time-delay circuitry, and AD/DA converters. The elements of a semiconductor capacitor include two conducting layers and a dielectric therebetween. Therefore, the performance of the capacitor is determined by three physical characteristics: (1) the thickness of the dielectric layer, (2) the surface area of the conducting layers, and (3) electrical or mechanical properties of the dielectric and the conducting materials.

For a highly-integrated dynamic random access memory (DRAM), each cell dimension must be as small as possible to increase the device density. However, the electrode area of the capacitor in each memory cell should be large enough for data storage. Therefore, a three-dimensional stacked capacitor cell has been developed to satisfy the requirement. For example, a crown-type capacitor utilizes an upward extending electrode structure to increase the surface area. This structure therefore reduces soft-error rate (SER) and is compatible with dielectric materials of a high dielectric constant.

However, the complicated three-dimensional structure requires a lot of micro-lithography steps which increase the manufacturing cost of the memory device. For instance, the method disclosed in U.S. Pat. No. 5,278,091 utilizes two more masks to fabricate a stacked capacitor.

Figure 1:
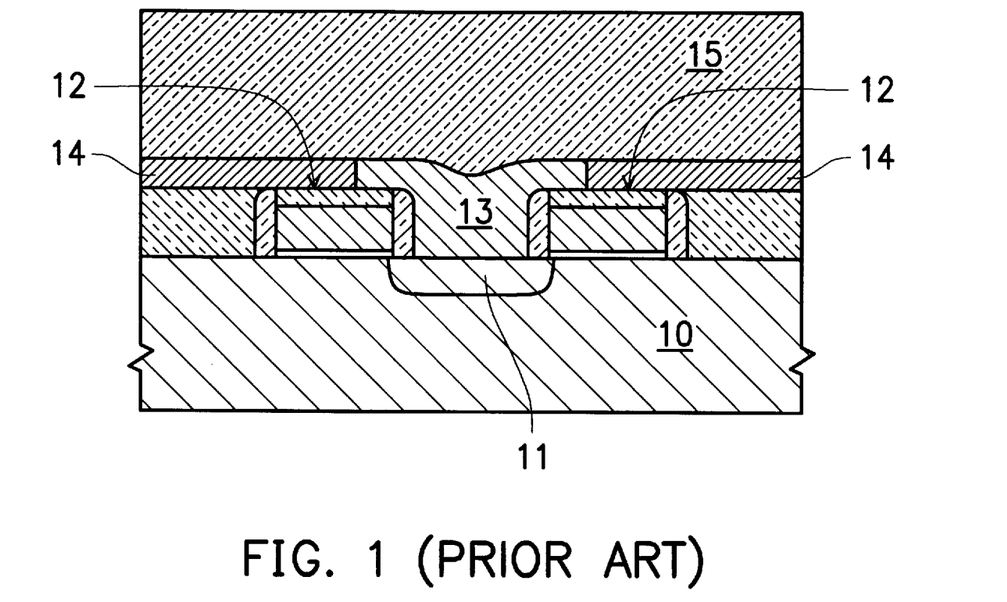
FIG. 1 and FIG. 2 are cross-sectional views illustrating the conventional method for fabricating a stacked capacitor.

The method, referring to FIG. 1, uses a first additional micro-lithography step to define the space between two word lines 12. The space is provided for forming a poly plug 13 between the word lines 12. These word lines 12 are then isolated by a silicon nitride layer 14. The poly plug 13 and the silicon nitride layer 14 are then covered by a silicon dioxide layer 15.

Figure 2:
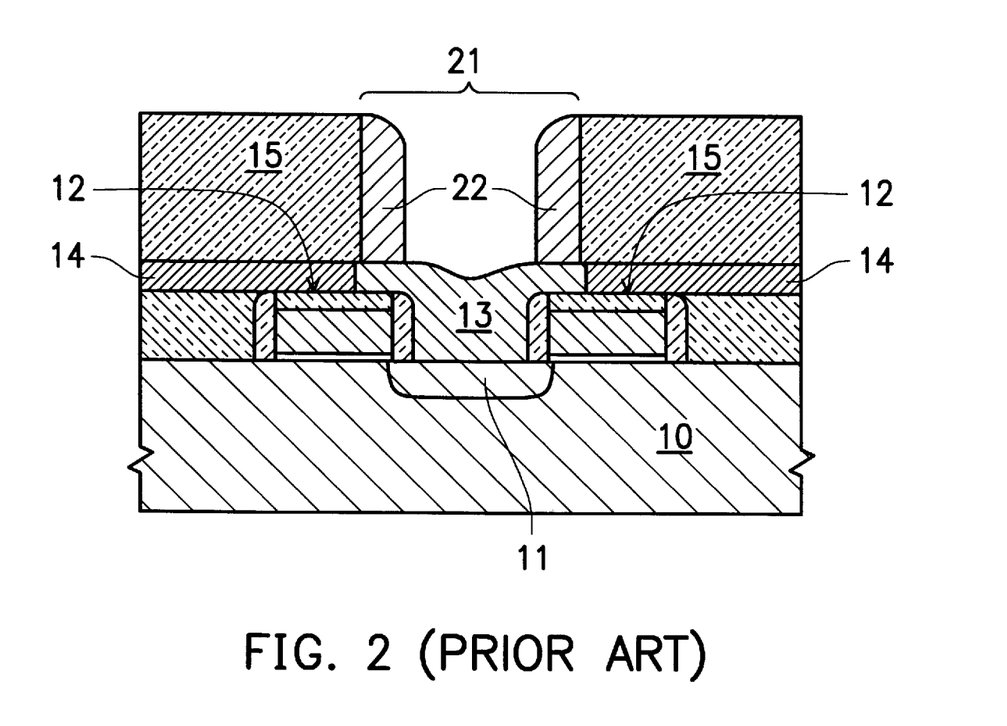

Referring to FIG. 2, another additional micro-lithography step is carried out to define the silicon dioxide layer 15, thereby forming an opening 21 to the poly plug 13. Then a poly spacer 22 is formed in the opening 21 for subsequent steps of the electrode formation. Since the method requires two additional micro-lithography steps, the cost is increased.

SUMMARY OF THE INVENTION

Accordingly, the present invention provides a method, in which less additional steps are required, for fabricating the electrodes of a semiconductor capacitor.

The method of the invention fabricates electrodes of a capacitor over a semiconductor substrate. The method includes the steps of: forming a first insulating layer over the semiconductor substrate; successively forming a first mask layer, a second insulating layer and a second mask layer, as a stacked layer, over the first insulating layer; defining the stacked layer to form an opening in which a portion of the first insulating layer is exposed; forming a first conducting layer over the stacked layer; forming a dielectric spacer on the sidewall of the first conducting layer; etching the first conducting layer and the first insulating layer by using the second mask layer and the dielectric spacer as a mask, thereby forming a contact window to expose a portion of the semiconductor substrate; forming a second conducting layer over the semiconductor substrate and filling in the contact window; etching back the second conducting layer to the second insulating layer, thereby retaining a portion of the second conducting layer in the contact window; and removing the dielectric spacer, the second mask layer and the second insulating layer.

DETAILED DESCRIPTION OF THE INVENTION

Figure 3:
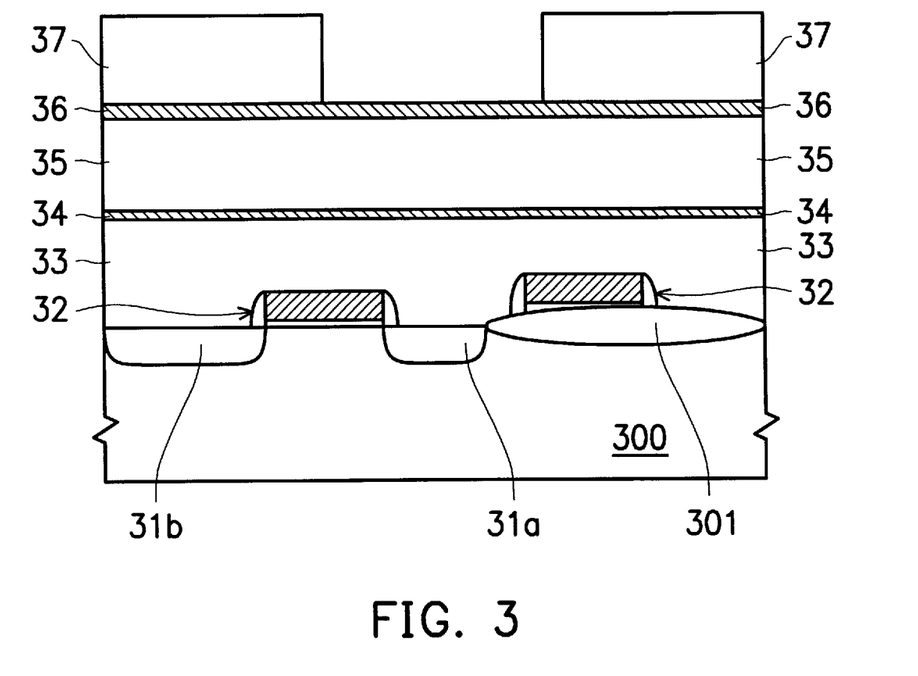
FIG. 3 through FIG. 13 are cross-sectional views illustrating the steps for fabricating a stacked capacitor according to the method of the invention.

Referring to FIG. 3, a semiconductor substrate 300 which is, for example, a silicon, germanium or gallium-arsenide substrate, is provided. Moreover, the substrate can be an epitaxial layer or a silicon on insulator (SOI) layer. For simplicity, a P-type silicon substrate is utilized in the embodiment.

Over the semiconductor substrate 300, a transistor is formed by a conventional method. For example, a thermal oxidation step, such as the LOCOS method, is carried out to form a field oxide layer 301 over the substrate 300, thereby defining an active region of the transistor. Then such steps such as deposition, micro-lithography, and ion implantation are carried out to form the transistor elements in the active region. The elements include a polysilicon gate structure 32, an N-type source diffusion region 31a and an N-type drain diffusion region 31b. The gate structure 32 can be a word line.

Then a base insulating layer 33 is formed over the semiconductor substrate 300. The base insulating layer 33 can be a silicon dioxide layer which is formed by methods such as thermal oxidation or chemical vapor deposition. For example, the silicon dioxide layer can be formed by reacting tetra-ethyl-ortho-silicate (TEOS) through a low-pressure chemical vapor deposition (LPCVD) process. Alternatively, the base insulating layer can be a BPSG layer which is formed by reacting TEOS, O3/O2, tri-ethyl-borate (TEB) and tri-methyl-phosphate (TMP) through an atmospheric-pressure chemical vapor deposition (APCVD) process. The thickness of the base insulating layer 33 is about 5000 Å.

The base insulating layer 33 is then successively covered by an insulating layer 35 and a mask layer 36. The insulating layer 35 and the mask layer 36 constitute a stacked layer. Moreover, an optional mask layer 34 can be deposited over the semiconductor substrate 300 before forming the stacked layer. The mask layers can be silicon nitride layers which are formed by, for example, reacting SiH2Cl2 and NH3 through a low-pressure chemical vapor deposition process. These mask layers are provided for etching protection layers. The mask layer 34 can have a thickness of about 300 Å. The mask layer 36 has a thickness of about 500 Å. The insulating layer 35 can be a silicon dioxide layer which is formed by chemical vapor deposition to a thickness of about 5000 Å. Moreover, for a micro-lithography step, a photoresist layer 37 for defining patterns is formed over the mask layer 36.

Figure 4:
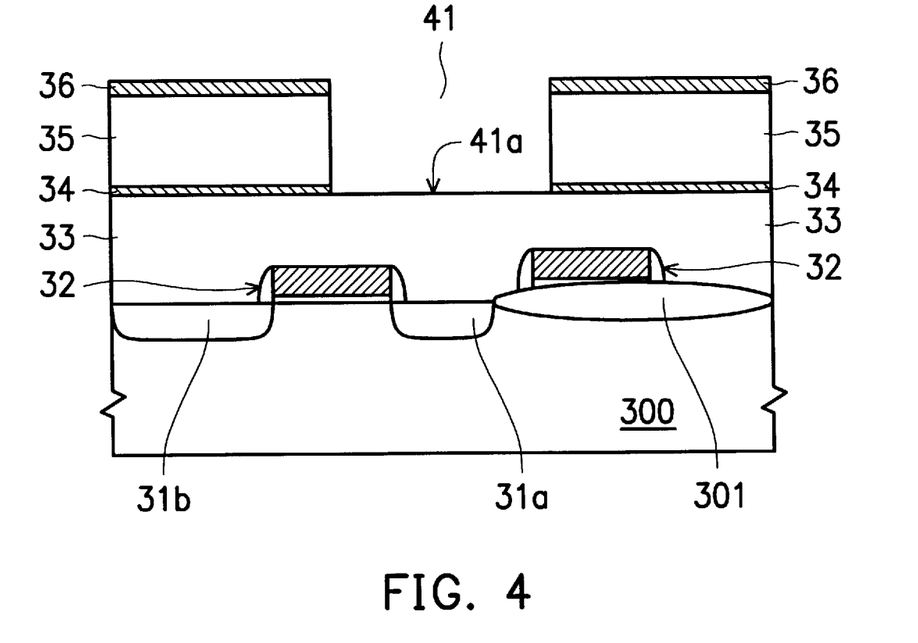

Referring to FIG. 4, an opening 41 is formed by, for example, anisotropically etching the mask layer 36, the insulating layer 35 and the mask layer 34 to expose a portion of the insulating layer 33 on bottom 41a. The etching step can be carried out by reactive ion etch (RIE) method in which CF plasma or preferably CHF3 gas is utilized for reacting. For without the mask layer 34 as an etching protection layer, the reaction time must be controlled precisely to etch the insulating layer 35 or 33 to a predetermined depth.

Figure 5:
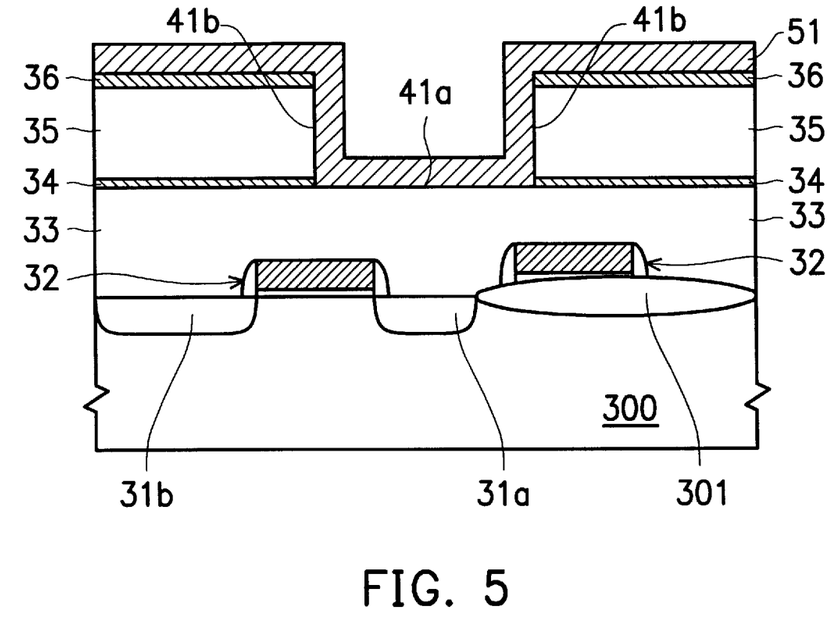

Referring to FIG. 5, a conducting layer 51 is formed over the insulating layer 36 and the sidewall 41b and bottom 41a of the stacked layer. The conducting layer 51 can be a polysilicon layer which is formed by, for example, reacting SiH4 through a low-pressure chemical vapor deposition process. The deposited polysilicon layer 51 has a thickness of about 1000 Å. In order to improve the conductivity of the polysilicon layer 51, methods such as diffusion, ion implantation, or the in-situ doped method can be utilized.

Figure 6:
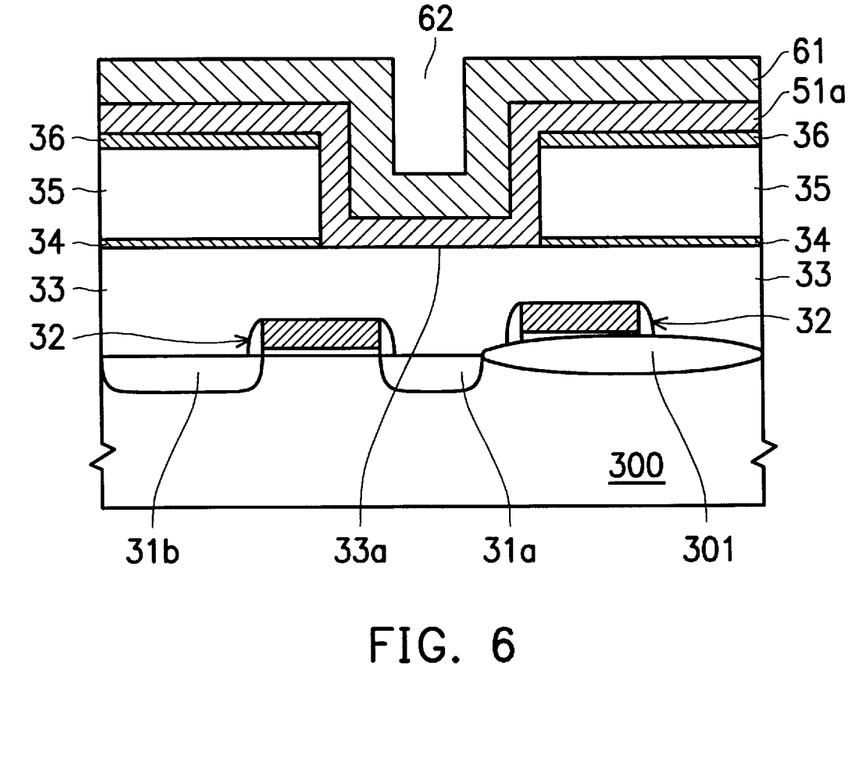

Referring to FIG. 6, a mask layer 61 is formed over the substrate. The mask layer 61 can be a silicon nitride layer which is formed by, for example, reacting SiH2Cl2 and NH3 through a low-pressure chemical vapor deposition process, thereby covering uniformly the conducting layer 51 and forming an opening 62 which is smaller than the opening 41.

Figure 7:
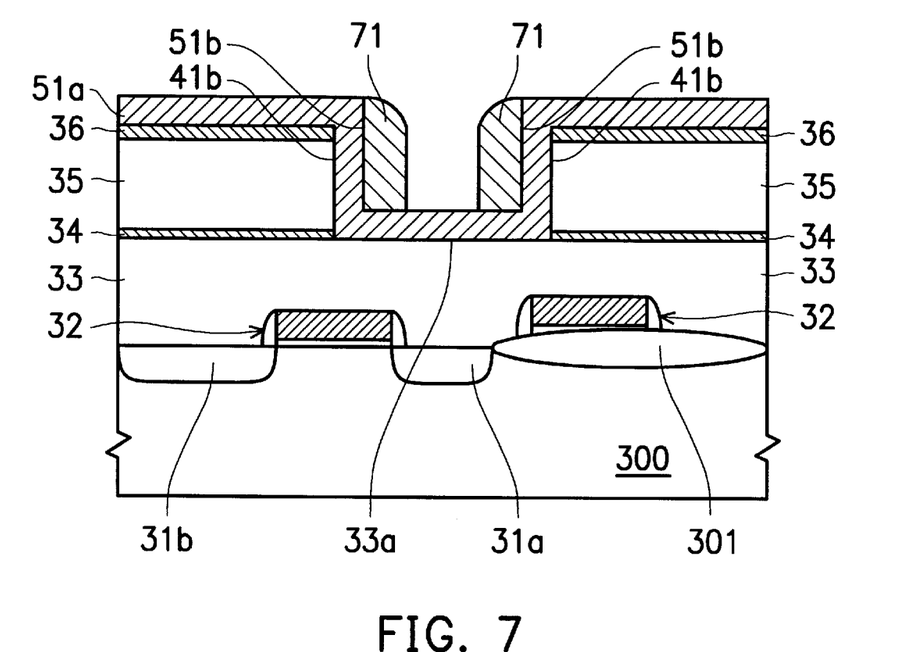

Referring to FIG. 7, a dielectric spacer 71 is formed over the substrate by etching back the mask layer 61. The etching back process also removes the mask layer over the conducting layer 51a.

Figure 8:
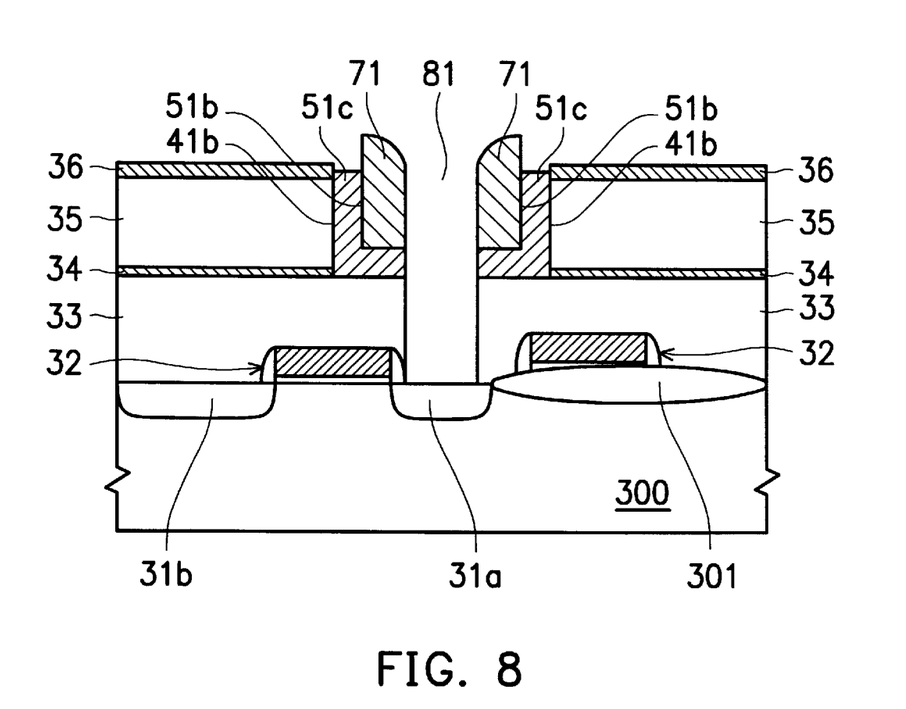

Referring to FIG. 8, a contact window 81 is formed over the substrate. Using the mask layer 36 and the dielectric spacer 71 as a mask, the conducting layer 51a is anisotropically etched by, for example, a reactive ion etch in which Cl2, HCl or SiCl2 gas is utilized, thereby exposing the insulating layer surface 33a defined by the dielectric spacer 71. Then the exposed insulating layer surface 33a is etched to the substrate 300. Therefore, the contact window 81 is formed to expose the diffusion region 31a. However, the conducting layer 51c between the sidewall of the stacked layer 41b and the dielectric spacer 71 is not removed. The insulating layer 33a can be etched by reactive ion etch method in which the carbon fluoride plasma or preferably CHF3 gas is utilized.

Figure 9:
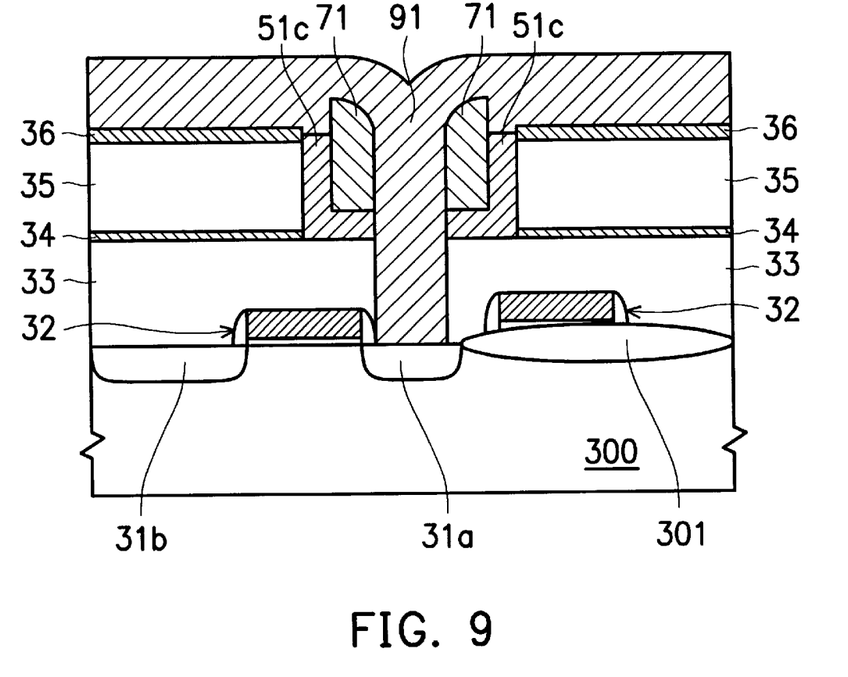

Referring to FIG. 9, a conducting layer 91 is formed by, for example, depositing a polysilicon layer over the mask layer 36, dielectric spacer 71 and conducting layer 51c and filling in the contact window 81. The polysilicon conducting layer 91 can be formed by reacting SiH4 through the LPCVD method to a thickness of about 2000 Å. Moreover, in order to improve the conductivity of the polysilicon conducting layer 91, methods such as diffusion, ion implantation or in-situ doped method can be utilized. Therefore, a conducting layer 91a having high conductivity is formed (FIG. 10).

Figure 10:
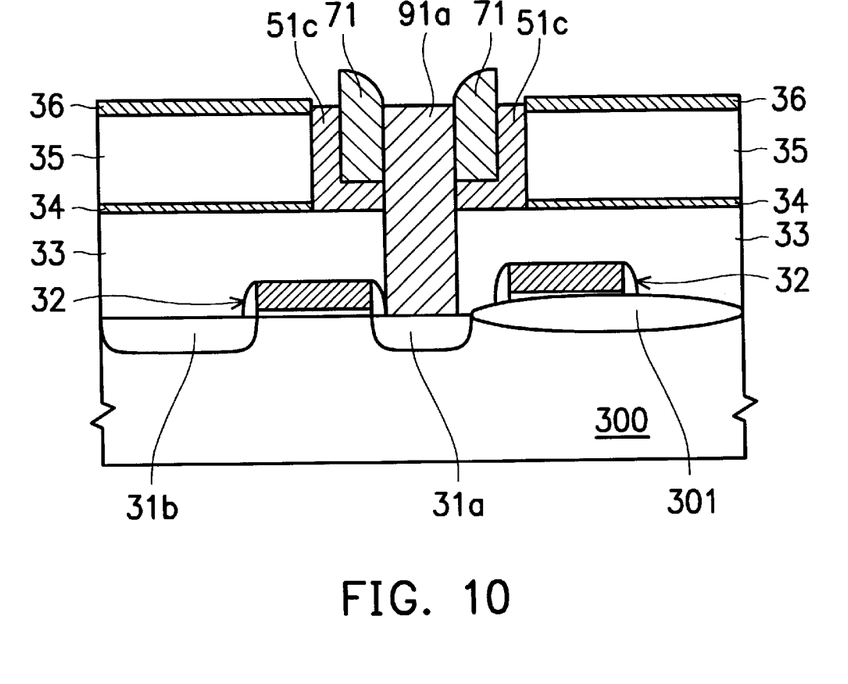

Referring to FIG. 10, the conducting layer 91a is etched back. In the etching process, the mask layer 36 is utilized as a mask, thereby leaving a portion of the conducting layer 91a in the contact window 81. The conducting layers 51c and 91a are electrically connected.

Figure 11:
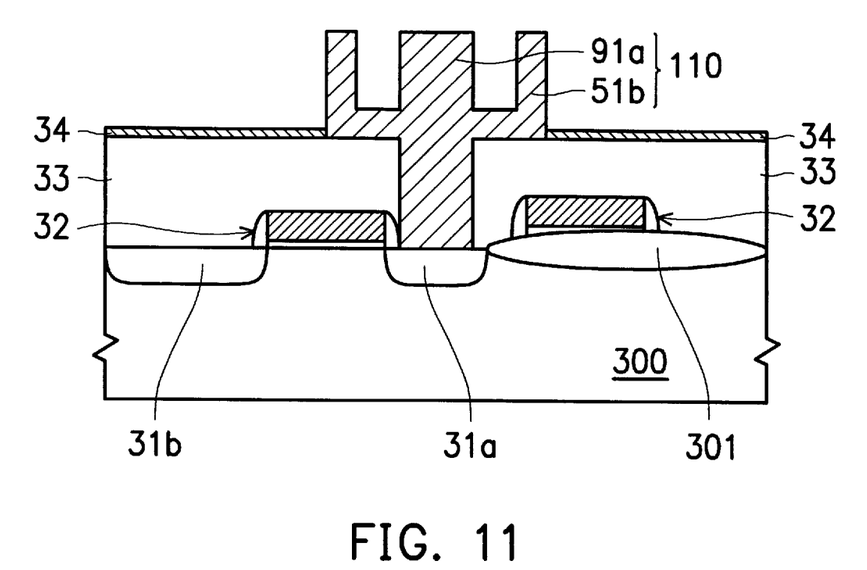

Referring to FIG. 11, another etching process is carried out to form a lower electrode 110 of the capacitor. The etching process utilizes the mask layer 34 as a mask to remove the dielectric spacer 71, the mask layer 36 and the insulating layer 35, thereby leaving the conducting layers 51b and 91a as the lower electrode. The dielectric spacer 71 and mask layer 36 can be removed by reactive ion etch method in which nitrogen fluoride plasma and, preferably, NF3 gas are utilized. Moreover, the insulating layer 35 is removed by the reactive ion etch method in which carbon fluoride plasma and, preferably, CHF3 gas are utilized.

Figure 12:
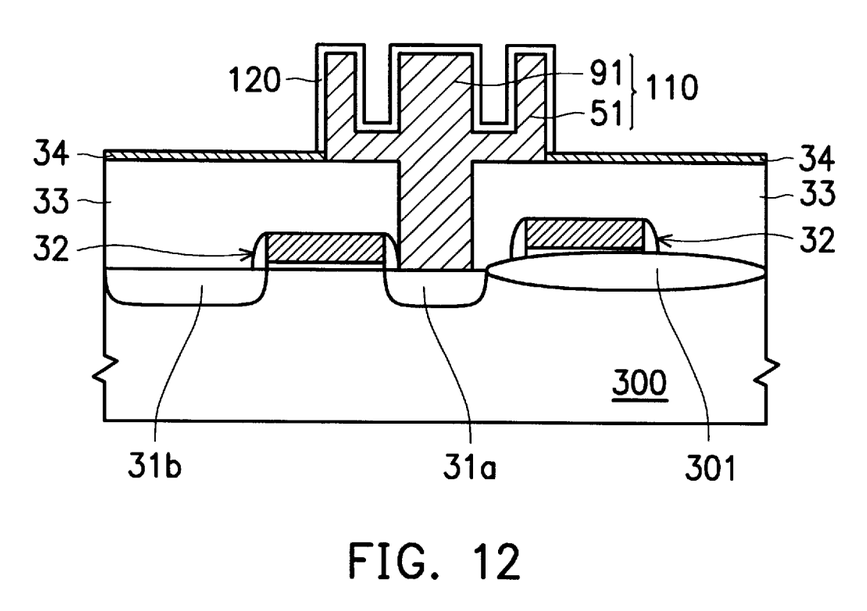

Referring to FIG. 12, a dielectric layer 120 is formed over the substrate. The dielectric layer 120 can be an oxide/nitride/oxide (ONO) layer or a Ta2O5 layer, which has a high dielectric constant.

Figure 13:
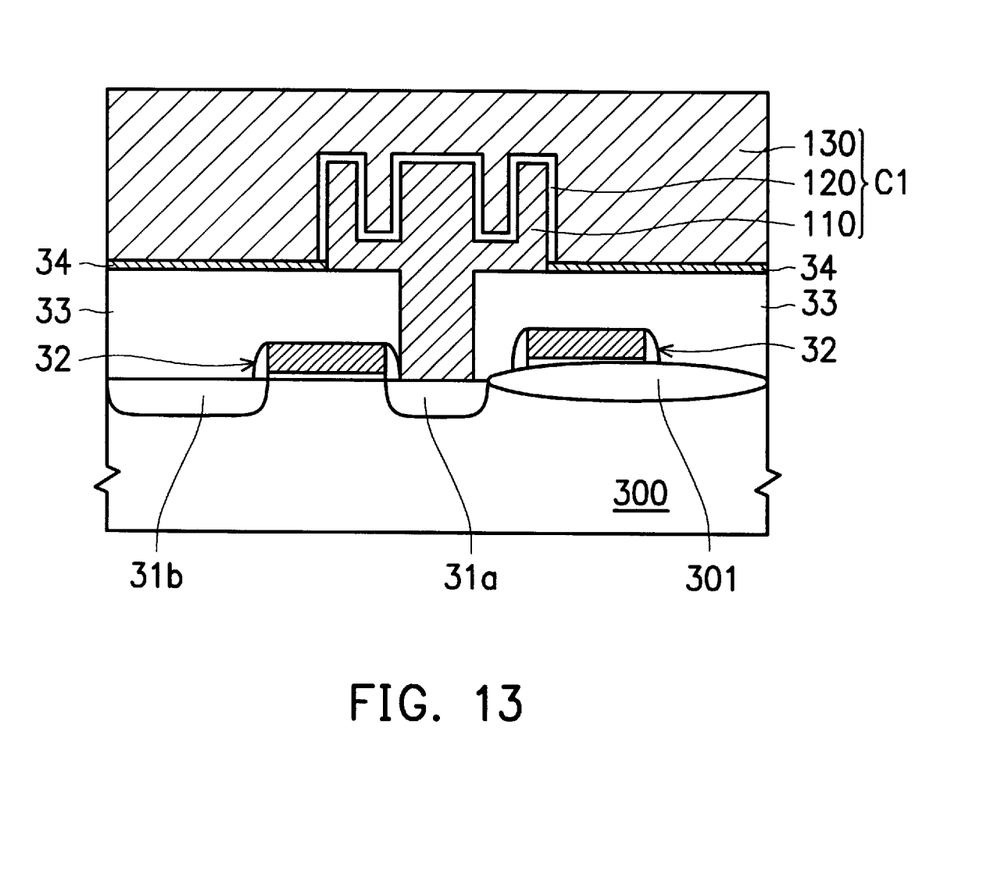

Referring to FIG. 13, a conducting layer 130 functioning as an upper electrode of the capacitor is formed. The conducting layer 130 can be a polysilicon layer which is formed by reacting SiH4 gas through the LPCVD process. Moreover, in order to improve the conductivity of the polysilicon conducting layer 130, methods such as diffusion, ion implantation or in-situ doped method can be utilized. Therefore, the capacitor including the lower electrode 110, the dielectric layer 120 and the upper electrode 130 is formed.

The capacitor fabricated by the method of the invention therefore provides the advantages of: (1) being unlimited by the process critical dimension; (2) requiring fewer microlithography steps; and (3) allowing smaller device dimensions. Therefore, the capacitor of the invention can be applied in a DRAM cell to increase the density of the memory device.

What is claimed is:

1. A method for fabricating capacitor electrodes, comprising the steps of:

providing a semiconductor substrate;

forming a base insulating layer over the semiconductor substrate;

forming a stacked layer, including an insulating layer and a mask layer, over the base insulating layer;

defining the stacked layer to form an opening to the base insulating layer;

forming a first conducting layer over the stacked layer;

forming a spacer on the sidewall of the first conducting layer in the opening;

etching the bottom of the opening by using the mask layer and the spacer as a mask to expose a portion of the semiconductor substrate;

forming a second conducting layer in the opening to electrically connect the exposed semiconductor substrate; and then removing the spacer.

2. A method for fabricating electrodes of a capacitor over a semiconductor substrate, comprising the steps of:

forming a first insulating layer over the semiconductor substrate;

successively forming a first mask layer, a second insulating layer and a second mask layer, as a stacked layer, over the first insulating layer defining the stacked layer to form an opening in which a portion of the first insulating layer is exposed;

forming a first conducting layer over the stacked layer;

forming a dielectric spacer on the sidewall of the first conducting layer;

etching the first conducting layer and the first insulating layer by using the second mask layer and the dielectric spacer as a mask, thereby forming a contact window to expose a portion of the semiconductor substrate;

forming a second conducting layer over the semiconductor substrate and filling in the contact window;

etching back the second conducting layer to the second insulating layer, thereby retaining a portion of the second conducting layer in the contact window; and removing the dielectric spacer, the second mask layer and the second insulating layer.

3. The method as claimed in claim 2, wherein the semiconductor substrate is a P-type silicon substrate.

4. The method as claimed in claim 3 further comprising forming a transistor over the semiconductor substrate, wherein the transistor has diffusion regions.

5. The method as claimed in claim 4, wherein the diffusion regions include an N-type source region and an N-type drain region.

6. The method as claimed in claim 5, wherein the exposed portion of the semiconductor substrate in the contact window is the source region.

7. The method as claimed in claim 2, wherein the first insulating layer and the second insulating layer are silicon dioxide layers.

8. The method as claimed in claim 7, wherein the silicon dioxide layers are formed by reacting tetra-ethyl-ortho-silicate (TEOS) through a low-pressure chemical vapor deposition process.

9. The method as claimed in claim 2, wherein the first insulating layer is a BPSG layer.

10. The method as claimed in claim 9, wherein the BPSG layer is formed by reacting TEOS, O3/O2, tri-ethyl-borate (TEB) and tri-methyl-phosphate (TMP) through an atmospheric pressure chemical vapor deposition process.

11. The method as claimed in claim 2, wherein the first mask layer and the second mask layer are silicon nitride layers.

12. The method as claimed in claim 11, wherein the silicon nitride layers are formed by reacting SiH2Cl2 and NH3 through a low-pressure chemical vapor deposition process.

13. The method as claimed in claim 2, wherein the steps for forming the opening through the stacked layer include:

defining a pattern on the stacked layer by a microlithography step; and anisotropically etching the second mask layer, the second insulating layer and the first mask layer to form the opening in which a portion of the first insulating layer is exposed.

14. The method as claimed in claim 2, wherein the first conducting layer is a polysilicon layer.

15. The method as claimed in claim 14, wherein the polysilicon layer is formed by reacting SiH4 through a low-pressure chemical vapor deposition process.

16. The method as claimed in claim 14, wherein the polysilicon layer is implanted with arsenate ions.

17. The method as claimed in claim 2, wherein the dielectric spacer is formed by:

forming a silicon nitride layer over the first conducting layer by a low-pressure chemical vapor deposition process; and etching back the silicon nitride layer to form the dielectric spacer.

18. The method as claimed in claim 17, wherein the contact window is formed by:

reactive ion etching the exposed first conducting layer by using the first mask layer and the dielectric spacer as a mask; and anisotropically etching the first conducting layer and the first insulating layer defined by the dielectric spacer, thereby forming the contact window in which a portion of the semiconductor substrate is exposed.

19. The method as claimed in claim 2, wherein the electrodes of the capacitor are formed by reactive ion etching the dielectric spacer, the second mask layer and the first insulating layer by using the first mask layer as a mask, thereby leaving a portion of the first conducting layer and the second conducting layer as a lower electrode.

20. A method for fabricating electrodes of a capacitor over a semiconductor substrate, comprising the steps of:

forming a first oxide layer over the semiconductor substrate;

successively forming a first silicon nitride layer, a second oxide layer and a second silicon nitride layer, as a stacked layer, over the first oxide layer;

defining the stacked layer to form an opening in which a portion of the first oxide layer is exposed;

forming a first polysilicon layer over the stacked layer;

forming a nitride spacer on the sidewall of the first polysilicon layer;

etching the first polysilicon layer and the first oxide layer by using the second silicon nitride layer and the nitride spacer as a mask, thereby forming a contact window to expose a portion of the semiconductor substrate;

forming a second polysilicon layer over the semiconductor substrate and filling in the contact window;

etching back the second polysilicon layer to the second silicon nitride layer, thereby retaining a portion of the second polysilicon layer in the contact window;

removing the nitride spacer, the second silicon nitride layer and the second oxide layer, thereby leaving a portion of the first polysilicon and the second polysilicon layer as a lower electrode of the capacitor;

forming a dielectric layer over the lower electrode; and forming a third polysilicon layer as an upper electrode over the dielectric layer.

* * * * *